(12) United States Patent
Sinha et al.

(10) Patent No.: US 12,188,961 B2
(45) Date of Patent: Jan. 7, 2025

(54) METHOD FOR ACCURATE PAD CONTACT TESTING

(71) Applicant: INTERNATIONAL BUSINESS MACHINES CORPORATION, Armonk, NY (US)

(72) Inventors: Kushagra Sinha, Wappingers Falls, NY (US); Zheng Xu, Wappingers Falls, NY (US); Yufei Wu, Poughkeepsie, NY (US); Myra Ahmad, San Jose, CA (US); Nikhilesh C Sahani, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/876,652

(22) Filed: Jul. 29, 2022

(65) Prior Publication Data
US 2024/0036074 A1 Feb. 1, 2024

(51) Int. Cl.
*G01R 1/067* (2006.01)
*G01R 31/28* (2006.01)

(52) U.S. Cl.
CPC ..... *G01R 1/06794* (2013.01); *G01R 31/2891* (2013.01)

(58) Field of Classification Search
None
See application file for complete search history.

(56) References Cited

U.S. PATENT DOCUMENTS

| 5,644,245 A | * | 7/1997 | Saitoh | G01R 31/2891 324/750.18 |
| 5,936,237 A | * | 8/1999 | van der Weide | B82Y 35/00 977/875 |
| 6,255,827 B1 | | 7/2001 | Farooq | |

(Continued)

FOREIGN PATENT DOCUMENTS

| CN | 103293342 A | 9/2013 |
| WO | 2008008065 A1 | 1/2008 |
| WO | 2016095807 A1 | 6/2016 |

OTHER PUBLICATIONS

Kota Hosaka et al; An Integrated CMOS-MEMS Probe having Two-Tips per Cantilever for Individual contact Sensing and Kelvin measurement with Two Cantilevers; School of Engineering, The University of Tokyo; 2013 IEEE Int. Conf. Microelectronic Test Structures (Year: 2013).*

(Continued)

*Primary Examiner* — Nasima Monsur
(74) *Attorney, Agent, or Firm* — Jeffrey Ingalls (57) ABSTRACT

A testing apparatus and a method for testing an integrated circuit are described. One embodiment of the testing apparatus may comprise a main probe pin configured for electrical testing of a sample, the sample having a terminal pad, and a secondary probe pin configured for contact testing of the main probe pin against the terminal pad. In some embodiments, the testing apparatus may further comprise an indicator circuit electrically connected to the main probe pin and the secondary probe pin. The indicator circuit may (Continued)

output a signal when the main probe pin and the secondary probe pin are in simultaneous electrical engagement with the terminal pad.

8 Claims, 6 Drawing Sheets

(56) References Cited

U.S. PATENT DOCUMENTS

| | | | |
|---|---|---|---|
| 6,281,701 B1* | 8/2001 | Yang | G09G 3/006 |
| | | | 324/754.03 |
| 7,023,226 B2 | 4/2006 | Okumura | |
| 7,091,730 B1* | 8/2006 | Parshotam | G01R 1/06705 |
| | | | 324/763.01 |
| 7,126,360 B1* | 10/2006 | Yang | G01R 1/06766 |
| | | | 324/755.05 |
| 8,058,886 B2 | 11/2011 | Petersen | |
| 8,421,491 B2 | 4/2013 | Chen | |
| 10,330,703 B2 | 6/2019 | Beng | |
| 11,215,639 B2 | 1/2022 | Matsubayashi | |
| 2009/0206859 A1* | 8/2009 | Swaim | G01R 1/06788 |
| | | | 324/756.03 |
| 2012/0115757 A1 | 5/2012 | Adams | |
| 2014/0005551 A1 | 1/2014 | Ozawa | |
| 2015/0018527 A1 | 1/2015 | Abkevich | |
| 2015/0185273 A1 | 7/2015 | Dirocco | |
| 2015/0369899 A1 | 12/2015 | Ben Jamaa | |
| 2016/0216321 A1 | 7/2016 | Edwards | |
| 2019/0064218 A1* | 2/2019 | Tsuji | H01S 5/04254 |
| 2020/0124663 A1* | 4/2020 | Nieves | G01R 31/311 |

OTHER PUBLICATIONS

Wang, Fei et al.; MEMS Vertical Probe Cards With Ultra Densely Arrayed Metal Probes for Wafer-Level IC Testing; I E E E Journal of Microelectromechanical Systems; Publication date: 2009; Journal of Microelectromechanical Systems, vol. 18, No. 4, Aug. 2009; pp. 933-941; (Year: 2009).*

"FormFactor", Electron Mec, DC, RF, Resistivity probes and probe cards, 2 pps., Copyright © 2009 Electron-Mec s.r.l. All Rights Reserved. P.IVA: 01773040157, <http://www.electron-mec.com/products/dc-rf-resistivity-probes-and-probe-cards/>.

Hosaka et al., "An integrated CMOS-MEMS Probe having Two-Tips per Cantilever for Individual Contact Sensing and Kelvin Measurement with Two Cantilevers", 2013 IEEE International Conference on Microelectronic Test Structures (ICMTS), 2013, pp. 3-6, doi: 10.1109/ICMTS.2013.6528136.

* cited by examiner

METHOD FOR ACCURATE PAD CONTACT TESTING

BACKGROUND

The present disclosure relates to testing methods and systems, and more specifically, to a method for accurate probe tip and pad contact tracing by an electrical tester.

An integrated circuit (IC) is a type of a semiconductor device. ICs typically comprise many small, interconnected components, such as diodes, vias, transistors, resistors, and capacitors. These components function together to enable the IC to perform a task, such as control of an electronic device or performing logic operations. ICs may be found in computers, televisions, automobiles, and cellular telephones.

Unfortunately, a manufacturing and/or design error in any one of the many components may render the IC incapable of functioning properly. For example, consider a memory device containing several ICs. If even one transistor within any of the ICs fails to function properly, the memory device may produce memory errors. Similarly, for example, an open via or a partially open via may act as a break that may prohibit the IC from functioning as designed. These errors may be detected using a testing protocol that involves an electrical tester.

SUMMARY

According to embodiments of the present disclosure, a testing apparatus comprising a main probe pin configured for electrical testing of a sample, the sample having a terminal pad, and a secondary probe pin configured for contact testing of the main probe pin against the terminal pad. In some embodiments, the testing apparatus may further comprise an indicator circuit electrically connected to the main probe pin and the secondary probe pin. The indicator circuit may output a signal when the main probe pin and the secondary probe pin are in simultaneous electrical engagement with the terminal pad.

According to embodiments of the present disclosure, a testing apparatus, comprising a pair of probe pins and an indicator circuit electrically connected to the pair of probe pins. The indicator circuit may be adapted to output a signal when the pair of probe pins are in simultaneous electrical engagement with a terminal pad.

According to embodiments of the present disclosure, a method for testing an integrated circuit, comprising providing a testing apparatus. The testing apparatus may comprise a main probe pin configured for electrical testing of a sample, the sample having a terminal pad. The testing apparatus may further comprise a secondary probe pin configured for contact testing of the main probe pin against the terminal pad. The testing apparatus may further comprise an indicator circuit electrically connected to the main probe pin and the secondary probe pin. The indicator circuit may output an output signal when the main probe pin and the secondary probe pin are in simultaneous electrical engagement with the terminal pad. The method may further comprise biasing the main probe pin and the secondary probe pin into simultaneous electrical engagement with the terminal pad; and receiving the output signal.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to testing methods and system; more particular aspects relate to a method for accurate probe tip and pad contact tracing by an electrical tester. While the present disclosure is not necessarily limited to such applications, various aspects of the disclosure may be appreciated through a discussion of various examples using this context.

Electrical testers are used in the electronics and/or electronics packaging industry to detect the presence of defects that effect the electrical performance of a semiconductor package, e.g., an integrated circuit (IC). These defects may include, without limitation, circuit line opens and shorts, and circuit line near opens and near shorts. In some testing protocols, the defects may also include design defects, such as logic errors.

In some embodiments, an electrical tester may comprise a probe card having a plurality of probe pins (also known as "probe tips"). These probe pins may be moved into physical and electrical engagement with conductive terminal pads/contact points on an IC. Many test protocols may specify precise alignment of each probe pin relative to its associated terminal pad, as the terminal pads used in modern ICs are often physically small. However, in practice, this alignment may be difficult to consistently achieve because the individual pins in the probe card may become worn and/or bent during routine use. This "wear-and-tear" may limit the electrical tester's ability to properly engage one or more of the associated terminal pads.

This problem may be particularly acute for test protocols that specify simultaneous electrical engagement by multiple probe pins. For example, one common test protocol is alternating current (AC) testing in which a 2×3 matrix of probe pins is used, typically in a Ground-Signal-Ground (GSG), SG, GS, GSGSG, GSSG, or SGS configuration. Using the current industrial techniques, it is often not feasible to reliably determine the quality of probe pin and pad contact. This means that a test engineer is often required to lift the probe and determine touch-down quality. This, in turn, may increase test-time, increase a risk of probe damage, and produce poor quality test data.

Another example is the variety of multi-pin probe cards used in direct current (DC) testing, typically in 1×25 or 2×50 configuration. While DC probe pins are normally visible for touch down, it is often not feasible using current industrial techniques to determine the quality of probe pin and pad contact. Again, the test engineer is often required to lift the probe and determine touch-down quality. This increases test-time, poor quality test data, increases risk of probe damage, and generally does not guarantee a good quality contact.

Additionally, in some applications, the contact points themselves may not be located at the precise coordinate specified in the design, but instead, have shifted to a new location during after-processing and heat treatment. In some cases, these positional errors may be large enough such that the probe pins may not make electrical contact with a designated terminal pads and the tester may falsely report an 'open' in the IC under test.

Invalid opens can be particularly costly test issue, as they may trigger a time-consuming probe adjustment-retest loop. The probe adjustment-retest loop may include a manual repositioning of the probe in the direction of the contact point, followed by restarting the test protocol. This probe adjustment-retest loop may continue until either the operator is convinced that the probes are contacting the contact points and the open fault indication is valid, or the search routine is completed. A software-controlled adjustment-retest loop may be similarly costly, as the software typically automatically steps (i.e., moves) the probe a preset distance and direction in an attempt to locate the contact point, followed by a retest. This process may be repeated a number of times in the event of a genuine fault.

Accordingly, one aspect of this disclosure is an electrical tester comprising a probe card having a plurality of pairs of secondary test tips and main probe tips, one pair for each contact point. In one embodiment, the secondary probe pin may comprise the same material (e.g., nickel alloy, etc.) as the main probe tip. In other embodiments, the secondary probe pin may be made of a different (e.g., lower cost) conducting material.

The electrical tester in some embodiments may further comprise a contact indicator for each pair of secondary probe tips and main probe tips. In some embodiments, the contact indicator may comprise a piezoelectric buzzer or LED light that automatically activates when a complete circuit is formed between the main probe tip and the secondary probe tip by contact with a terminal pad (e.g., when power can flow from the main probe tip through the terminal pad to the secondary probe tip). In other embodiments, the contact indicator may comprise an ohmmeter meter, which may detect a drop in resistance between the main probe tip and the secondary probe tip by simultaneous contact with a terminal pad. In other embodiments, the contact indicator may comprise a voltmeter, which may detect a voltage applied by the main probe at the secondary probe if a complete circuit is formed. In other embodiments, the contact indicator may comprise an ammeter, which may detect current flowing from the main probe through the terminal pad and into the secondary probe. The contact indictor may be part of an indicator circuit in some embodiments. In some embodiments, the indicator circuit generates an output signal in real-time i.e., substantially simultaneously with each contact.

Figure 1:
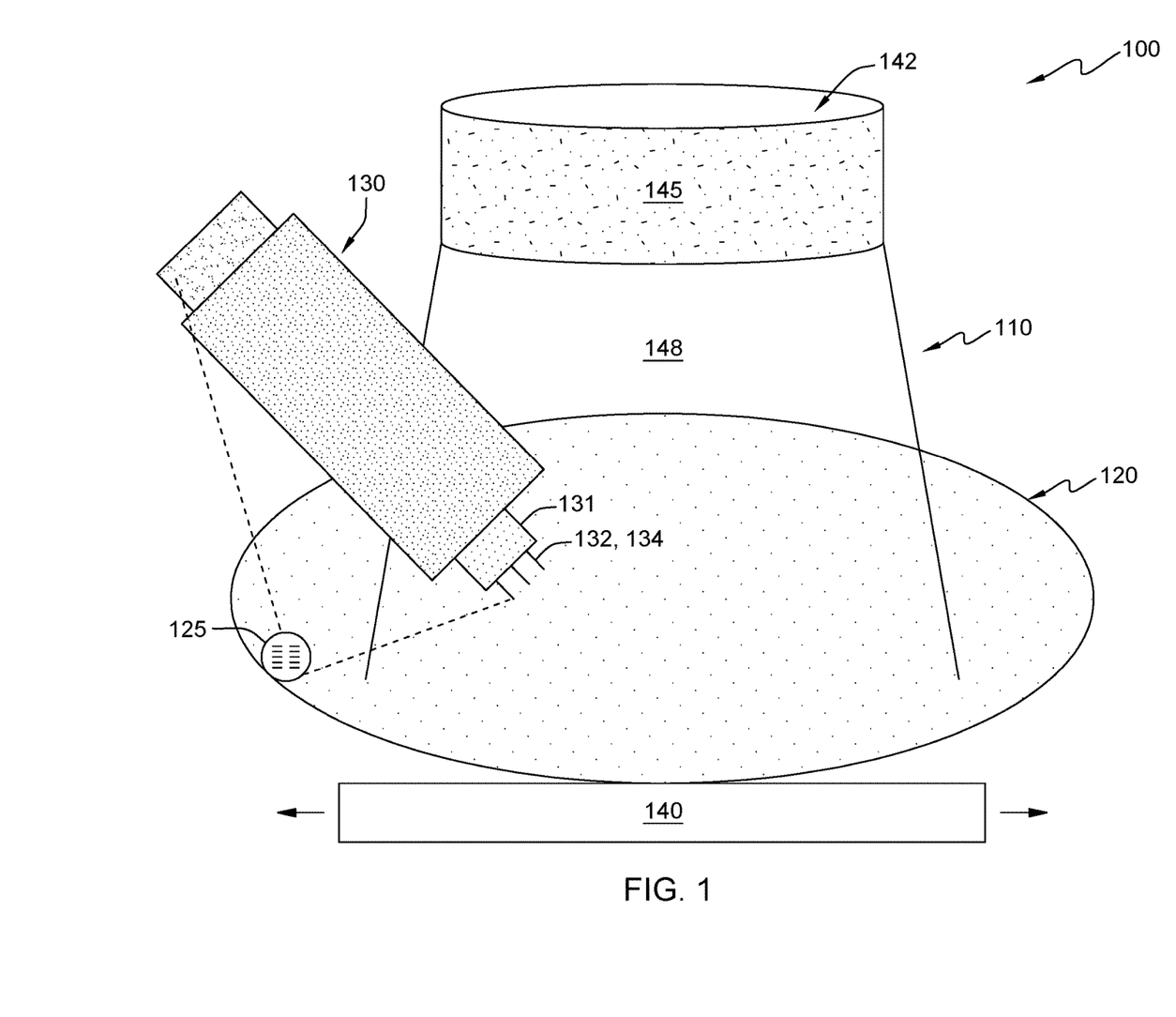
FIG. 1 is a schematic diagram of a test bench, consistent with some embodiments.

FIG. 1 is a schematic diagram of a test bench 100, consistent with some embodiments. The test bench 100 may comprise a test bed 110, a test subject 120, and an electrical tester 130. The test subject may comprise a plurality of terminal pads 125. The electrical tester 130 may comprise a probe card 131, which in turn, may comprise a plurality of pairs of main probe pins 132 and secondary probe pins 134. The test bench 100 may further comprise a fixture 140 adapted to enable manual or software-directed movements of the test bed 110 to enable the probe pins 132, 134 to physically and electrically engage one of the terminal pads 125. The test bench 100 may further comprise a microscope 142 to help align the probe pins 132, 134 with the terminal pads 125 when used in manual mode. The microscope 142 may have a microscope lens 145 and an associated field of view 148.

Figure 2A:
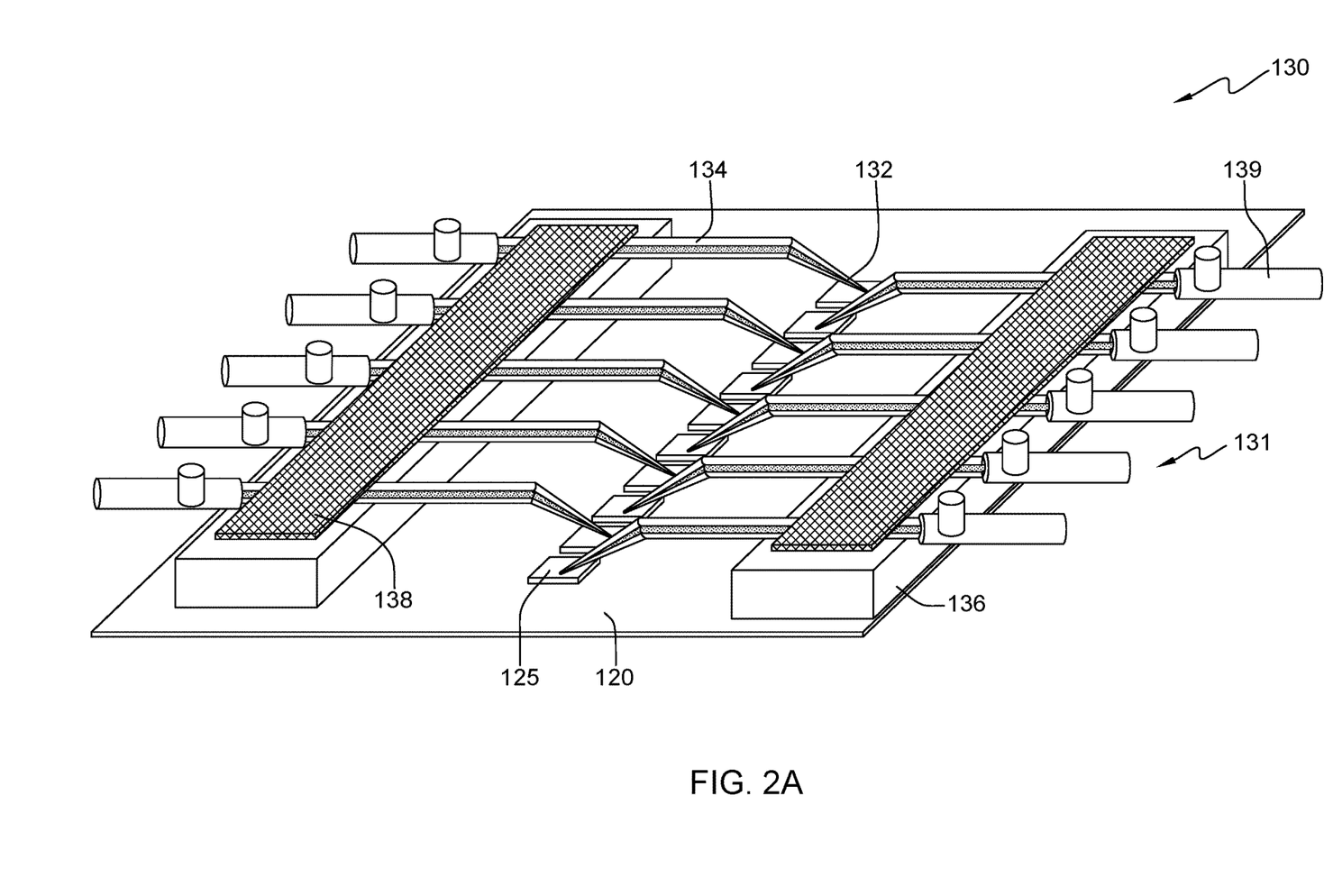
FIG. 2A is a partial perspective view of a first embodiment of the electrical tester.

FIG. 2A is a partial perspective view of a first embodiment of the electrical tester 130. As an illustrative example, this electrical tester 130 embodiment may be optimized to perform direct current (DC) based tests on the test subject 120. The DC test may involve passing electrical signals to a 1×10 array of terminal pads 125 on the test subject 120. The probe card 131 in this embodiment may comprise a 1×10 array of main probe pins 132, one for each of the terminal pads 125. The probe card 131 in this embodiment may also comprise a 1×10 array of secondary probe pins 134. Each secondary probe pin 134 may be paired with exactly one of the main probe pins 132, forming a 1×10 array of pairs of pins 132, 134. The electrical tester 130 may also include a ceramic ring 136 configured to position the main probe pins 132 and secondary probe pins vertically with respect to the test subject 120 (e.g., to prevent the probe pins 132, 134 from crashing into the test subject 120, and thus, suffering damage). The probe card 131 may also comprise an epoxy layer 138 that fixedly attaches the pairs of probe pins 132, 134 to the ceramic ring 136.

Figure 2B:
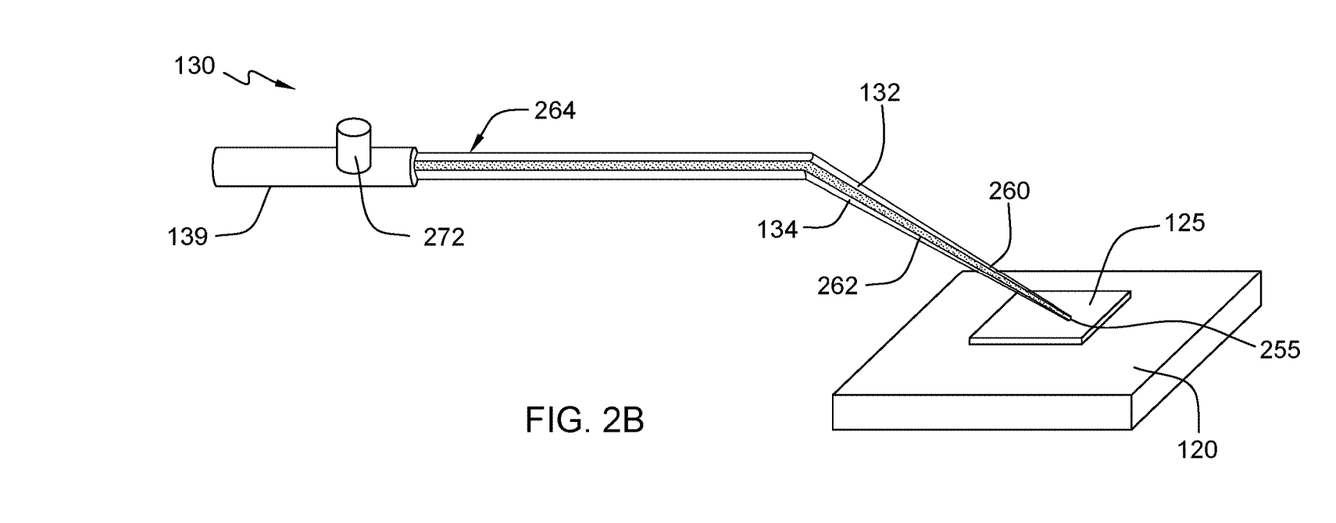
FIG. 2B is a perspective view of a single main probe tip and supplemental probe tip pair in the first embodiment of the electrical tester.

FIG. 2B is a perspective view of a single main probe tip 132 and supplemental probe tip 134 pair in the first embodiment of the electrical tester 130. In some embodiments, an exposed end 260 of each main probe pins 132 may be electrically insulated from an exposed end 262 of its associated secondary probe pins 134 by, e.g., an air gap 255 and/or an electrically insulating coating on the probe pins 132, 134 (not shown). An opposite, fixed end 264 of each main probe pin 132 may be electrically coupled to the secondary probe pin 134 by a contact indicator circuit (see FIG. 2C) and may be protected by a non-magnetic sheath 139.

Figure 2C:
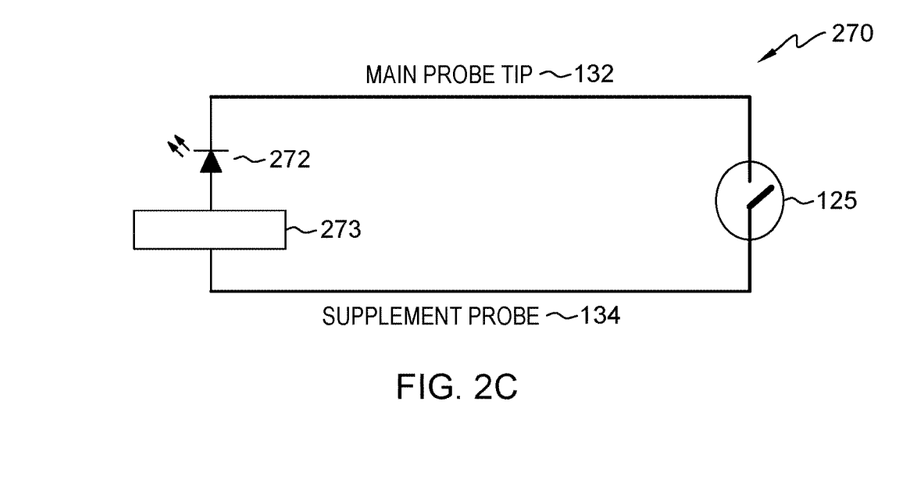
FIG. 2C is a schematic view of an indicator circuit of the first embodiment of the electrical tester.

FIG. 2C is a schematic view of an indicator circuit 270 of the first embodiment of the electrical tester 130. Each pair of main probe tips 132 and secondary probe tips 134 may have an associated contact indicator circuit 270. The contact indicator circuit may include an indicator 272 and a voltage source 273. The indicator 272 in FIGS. 2A-2B may be a light emitting diode (LED). The LED may be attached in series with the probe tips 132, 134, with one pin of the LED connected to the supplemental probe pin 134, and the other pin connected to the main probe tip 132. In operation, the terminal pad 125 may act in the indicator circuit 270 as a switch, providing a 'short' for the electron flow from a voltage source 273 if (and only if) both probe pins 132, 134 are in physical and electrical engagement with the terminal pad 125.

The indicator 272 embodiment in FIGS. 2A-2C may be desirable because the LED is normally-off, i.e., the LED will not emit light when the contact indicator circuit 270 is open. However, when the user and/or software brings the main probe pin 132 and secondary probe pin 134 into simultaneous physical/electrical engagement with the terminal pad 125, power may begin flow through the indicator LED, causes it to emit a light signal in real-time (i.e., substantially simultaneous with contact). This light signal, in turn, may be used by the test engineer to visually confirm that the respective main probe pin 132 is in proper electrical engagement with its associated terminal pad 125.

Figure 3:
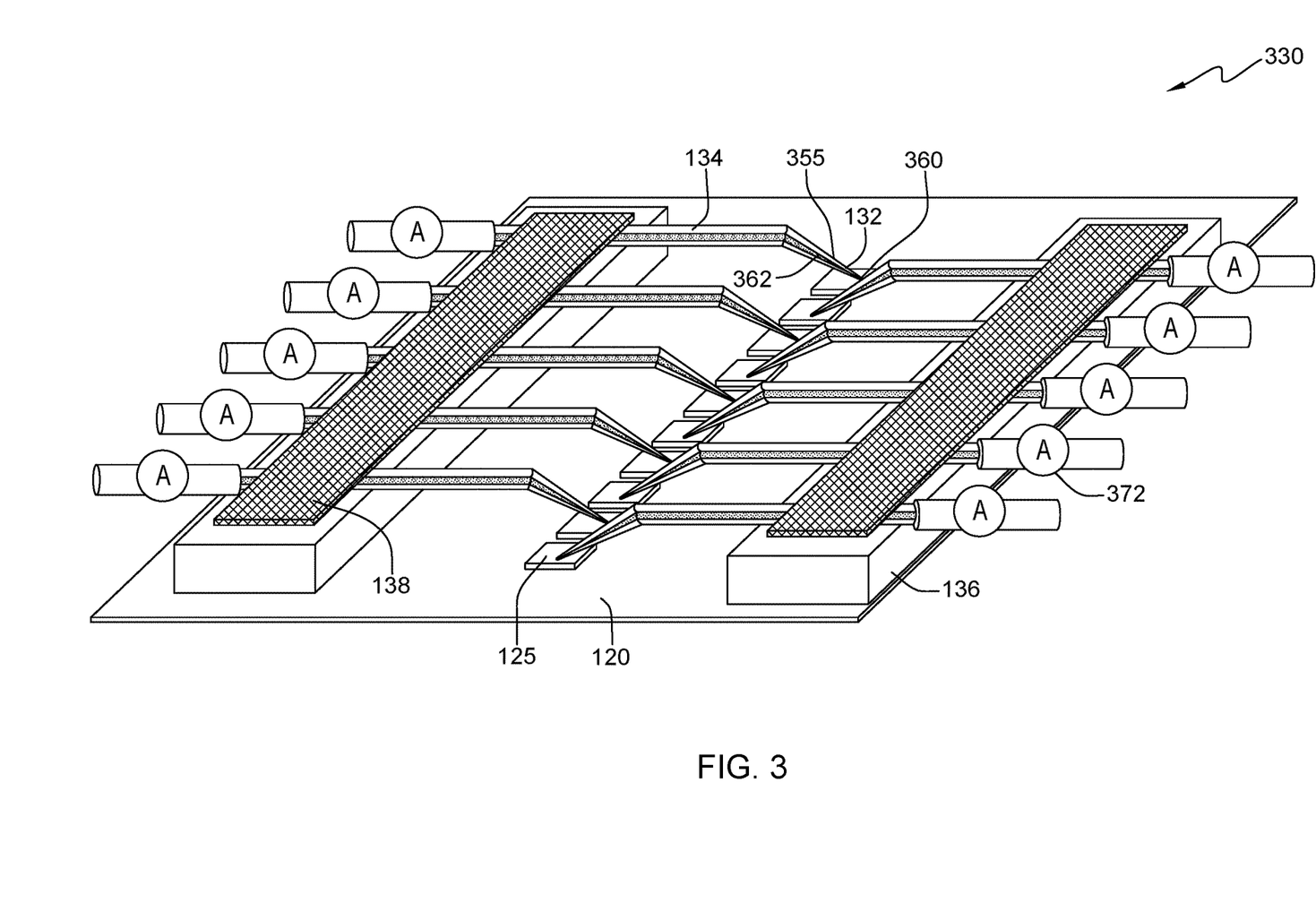
FIG. 3 is a partial perspective view of a second embodiment of the electrical tester.

FIG. 3 is a partial perspective view of a second embodiment of the electrical tester 330. As in the previous embodiment, this electrical tester 130 embodiment may comprise a probe card 132 having a 1×10 array of main probe pins 132, one for each of the terminal pads 125 (only one pair depicted in detail for clarity). Each main probe pin 132 may have an associated secondary probe pin 134, forming a pair of probe pins 132, 134. An exposed end 360 of each main probe pin 132 may be electrically insulated from an exposed end 362 of its associated secondary probe pin 134 by, e.g., an air gap 355. An opposite, fixed end 364 of each main probe pin 132 may be electrically coupled to its associated secondary probe pin 134 by a contact indicator 372 of a contact indicator circuit.

The indicator 372 in the embodiment depicted in FIG. 3 may be an ammeter. In operation, current from, e.g., a current source can flow through a contact indicator circuit if, and only if, the main probe pin 132 and secondary probe pin 134 are in electrical engagement with the same terminal pad 125. This current may be measured by the ammeter indicator 372. The output of the ammeter indicator 372 may be directly used in real time, e.g., by test software or by the test engineer visually inspecting an output dial or the like.

Alternatively, the indicator 372 in the embodiment depicted in FIG. 3 may be a voltmeter that detects a change in voltage between the main probe pin 132 and secondary probe pin 134 are in electrical engagement with the same terminal pad 125. Alternatively, the indicator 372 in the embodiment depicted in FIG. 3 may be an ohmmeter that detects a real time change in resistance between the main probe pin 132 and secondary probe pin 134 are in electrical engagement with the same terminal pad 125.

Figure 4:
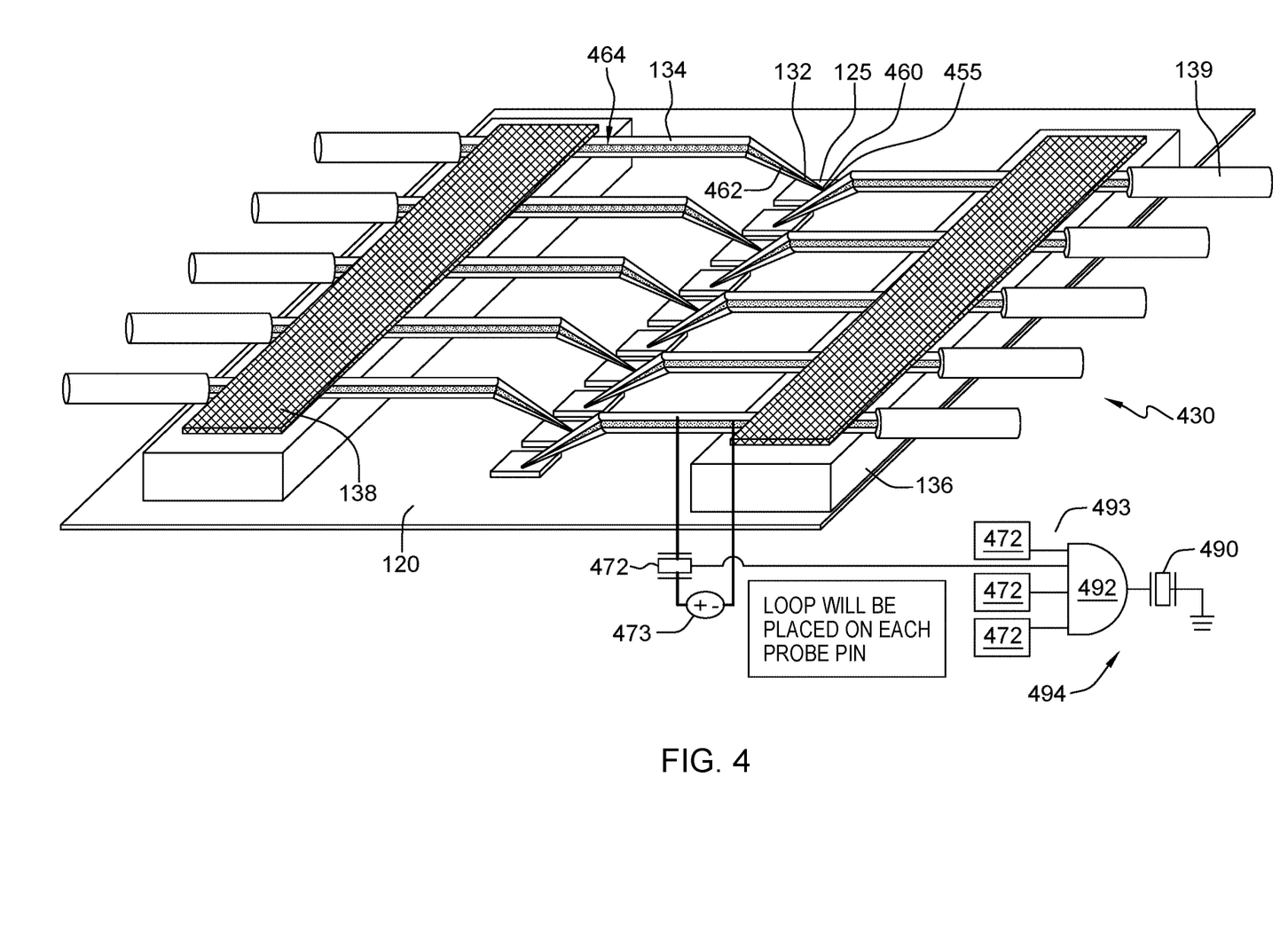
FIG. 4 is a partial perspective view of a third embodiment of the electrical tester.

FIG. 4 is a partial perspective view of a third embodiment of the electrical tester 130. As in the previous embodiments, this embodiment of the electrical tester 130 may comprise a probe card 132 having a 1×10 array of main probe pins 132 and secondary probe pins 134, one for each of the terminal pads 125 (only one pair depicted in detail for clarity). An exposed end 460 of each main probe pin 132 may be electrically insulated from an exposed end 462 of its associated secondary probe pin 134 by, e.g., an air gap 455. An opposite, fixed end 464 of each main probe pin 132 may be electrically coupled to a secondary probe pin 134 by a contact indicator 472. This contact indicator 472 may comprise one of the circuits described with reference to FIGS. 2-3 (e.g., a voltmeter, an ohmmeter, etc., and a voltage source 473).

The embodiment in FIG. 4 may further comprise a global indicator 490, which may comprise a logical AND gate 492 having a plurality of inputs 493 connected to the contact indicators 472 for the pairs of probe pins 132, 134. The global contact indicator 490 may further comprise a global indicator 494, such as a LED and/or piezoelectric buzzer, connected to an output of the logical AND gate 492. In operation, the LED and/or piezoelectric buzzer may be activated if, and only if, all of the pair of probe pins 132, 134 are in simultaneous electrical engagement with their respective terminal pads 125.

Figure 5:
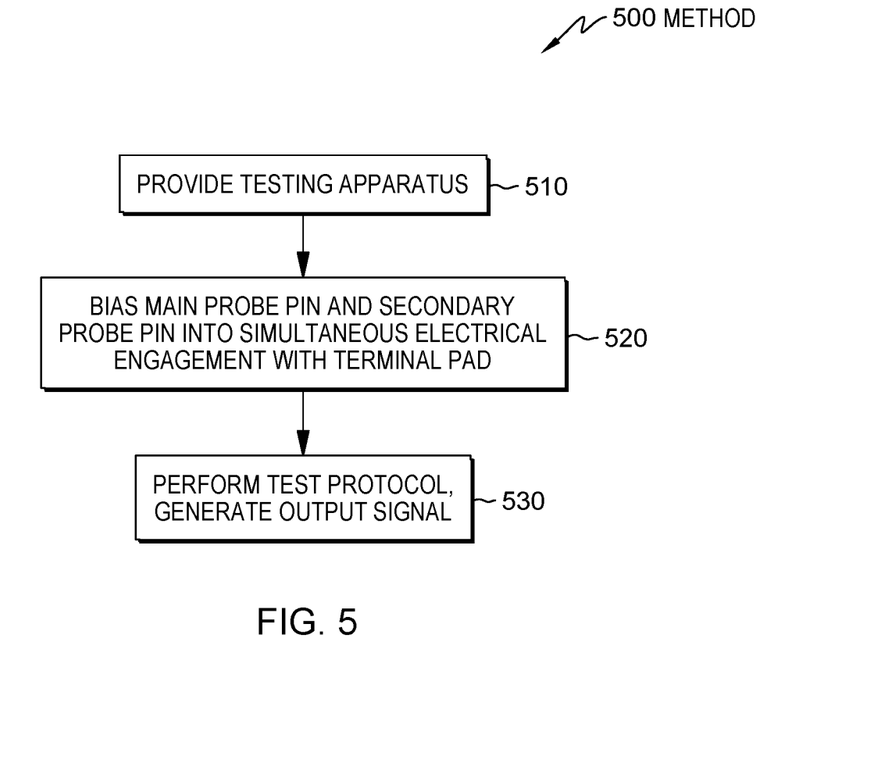
FIG. 5 is a flow chart illustrating one method of testing an integrated circuit, consistent with some embodiments.

FIG. 5 is a flow chart illustrating one method 500 of testing an integrated circuit, consistent with some embodiments. At operation 510, a test engineer may provide a testing apparatus. The testing apparatus may comprise a main probe pin configured for electrical testing of a sample, the sample having a terminal pad, a secondary probe pin configured for contact testing of the main probe pin against the terminal pad, and an indicator circuit electrically connected to the main probe pin and the secondary probe pin, wherein the indicator circuit outputs an output signal when the main probe pin and the secondary probe pin are in simultaneous electrical engagement with the terminal pad. At operation 520, the main probe pin and the secondary probe pin may be biased into simultaneous electrical engagement with the terminal pad, and proper engagement may be determined in real time via the indicator circuit(s). At operation 530, a test protocol may be performed, and an output signal may be generated, and then received by the test engineer.

In some embodiments, the testing apparatus may further comprise a plurality of pairs of main probe pins and secondary probe pins; and a global indicator circuit that outputs a global signal when each of the plurality of pairs of main probe pins and the secondary probe pins are in simultaneous electrical engagement with one of a plurality of terminal pads. In these embodiments, operation 520 may include biasing the plurality of pairs of main probe pins and the secondary probe pin into simultaneous electrical engagement with the plurality of terminal pads; and operation 530 may include receiving the global signal.

General

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A testing apparatus, comprising:
   a plurality of probe pairs arranged in an array to correspond to an array of terminal pads of a sample, each of the probe pairs including a main probe pin and a secondary probe pin separated from the main probe pin by an insulator;
   a plurality of contact indicators; wherein each one of the contact indicators of the plurality of contact indicator electrically connected in series with the main probe pin and the secondary probe pin for each of the plurality of probe pairs;
   a global indicator circuit electrically connected to the plurality of probe pairs, wherein the global indicator circuit includes
   a logical AND gate electrically connected to the plurality of probe pairs and configured to receive input from each of the contact indictors, and
   a global indicator electrically connected in series to the logical AND gate and configured to receive an output of the logical AND gate, and configured to emit at least one of an audible or visual indication when both of the main probe pin and secondary probe pin for all of the plurality of probe pairs are in physical and electrical engagement with their respective terminal pads of the sample to complete the global electrical circuit.

2. The testing apparatus of claim 1, wherein the global indicator is a light-emitting diode (LED).

3. The testing apparatus of claim 1, wherein the global indicator is a piezoelectric buzzer.

4. A method for testing an integrated circuit, the method comprising:

providing a testing apparatus, the testing apparatus comprising:

a plurality of probe pairs arranged in an array to correspond to an array of terminal pads of a sample, each of the probe pairs including a main probe pin and a secondary probe pin separated from the main probe pin by an insulator;

a plurality of contact indicators; wherein each one of the contact indicators of the plurality of contact indicator electrically connected in series with the main probe pin and the secondary probe pin for each of the plurality of probe pairs;

a global indicator circuit electrically connected to the plurality of probe pairs, wherein the global indicator circuit includes a logical AND gate electrically connected to the plurality of probe pairs and configured to receive input from each of the contact indictors, and a global indicator electrically connected in series to the logical AND gate and configured to receive an output of the logical AND gate, and configured to emit at least one of an audible or visual indication when both of the main probe pin and secondary probe pin for all of the plurality of probe pairs are in physical and electrical engagement with their respective terminal pads of the sample to complete the global electrical circuit; and biasing the plurality of the probe pairs of the testing apparatus toward the terminal pad until the global indicator emits the at least one of the audible or visual indication.

5. The method of claim 4, wherein each of the contact indicator is light-emitting diode (LED).

6. The method of claim 4, wherein each of the contact indicator is an ohmmeter.

7. The testing apparatus of claim 4, wherein the global indicator is a light-emitting diode (LED).

8. The testing apparatus of claim 4, wherein the global indicator is a piezoelectric buzzer.

* * * * *